(12) United States Patent
Christensen et al.

(10) Patent No.: US 9,965,930 B1
(45) Date of Patent: May 8, 2018

(54) ELECTRONIC DEVICE INCLUDING PIEZOELECTRIC MATERIAL LAYER AND TEMPERATURE COMPENSATION CIRCUITRY AND RELATED METHODS

(71) Applicant: Apple Inc., Cupertino, CA (US)

(72) Inventors: David L. Christensen, Los Altos Hills, CA (US); Alex J. Lehmann, Sunnyvale, CA (US); Qiliang Xu, Livermore, CA (US)

(73) Assignee: APPLE INC., Cupertino, CA (US)

( * ) Notice: Subject to any disclaimer, the term of this patent is extended or adjusted under 35 U.S.C. 154(b) by 0 days. days.

(21) Appl. No.: 15/698,792

(22) Filed: Sep. 8, 2017

Related U.S. Application Data

(60) Provisional application No. 62/472,252, filed on Mar. 16, 2017.

(51) Int. Cl.
*H04M 1/00* (2006.01)
*G08B 6/00* (2006.01)
(Continued)

(52) U.S. Cl.
CPC ............ *G08B 6/00* (2013.01); *G01L 9/085* (2013.01); *H01L 41/042* (2013.01);
(Continued)

(58) Field of Classification Search
None
See application file for complete search history.

(56) References Cited

U.S. PATENT DOCUMENTS 3,940,974 A * 3/1976 Taylor ................... G01K 7/003
250/338.3
6,021,552 A * 2/2000 Kishima ................ H01L 41/29
29/25.35

(Continued)

FOREIGN PATENT DOCUMENTS

WO    2013169299 A1    11/2013
WO    2013169303 A1    11/2013
(Continued)

OTHER PUBLICATIONS

Product Specification Sheet: Geeplus, VIBRO1 Vibration Actuator, 2 pages, www.geeplus.biz, downloaded on Jul. 15, 2015.

*Primary Examiner* — Tuan A Tran
(74) *Attorney, Agent, or Firm* — Allen, Dyer, Doppelt + Gilchrist, P.A. Attorneys at Law

(57) ABSTRACT

An electronic device may include a beam layer, a piezoelectric material layer coupled to the beam layer, and a temperature sensor adjacent the piezoelectric material layer. The electronic device may also include drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer. The high frequency drive signal may have a higher frequency than the low frequency drive signal. The electronic device may also include readout circuitry coupled to the piezoelectric material layer and configured to generate a sensed pressure value based upon the high frequency drive signal. Temperature compensation circuitry may cooperate with the readout circuitry to compensate the sensed pressure value based upon the temperature sensor.

20 Claims, 10 Drawing Sheets

(51) Int. Cl.
*H01L 41/04* (2006.01)
*H01L 41/047* (2006.01)
*H04M 1/02* (2006.01)
*G01L 9/08* (2006.01)
*G06F 3/01* (2006.01)

(52) U.S. Cl.
CPC ........ *H01L 41/047* (2013.01); *H04M 1/0266* (2013.01); *G06F 3/016* (2013.01); *H04M 2250/12* (2013.01); *H04M 2250/22* (2013.01)

(56) References Cited

U.S. PATENT DOCUMENTS

| | | | | |
|---|---|---|---|---|
| 7,495,405 | B2 * | 2/2009 | Sugiura | G01L 1/26 318/266 |
| 7,690,256 | B2 * | 4/2010 | Ishii | H03B 5/362 331/116 R |
| 7,812,692 | B2 * | 10/2010 | Ayazi | H03H 3/0076 310/321 |
| 7,816,838 | B2 | 10/2010 | Leskinen et al. | |
| 8,169,402 | B2 | 5/2012 | Shahoian et al. | |
| 8,575,819 | B1 * | 11/2013 | Bhugra | H03H 9/173 310/317 |
| 8,680,931 | B1 * | 3/2014 | Pan | H03H 9/02448 310/313 B |
| 8,896,188 | B2 * | 11/2014 | Kuypers | H01L 41/09 310/313 B |
| 8,987,666 | B2 * | 3/2015 | Park | G01J 5/44 250/338.1 |
| 9,000,854 | B1 * | 4/2015 | Mohanty | H03B 5/326 331/116 R |
| 9,240,767 | B2 * | 1/2016 | Burgess | H03H 9/175 |
| 9,651,376 | B2 * | 5/2017 | Zolfagharkhani | G01C 19/5712 |
| 9,712,128 | B2 * | 7/2017 | Doll | H03H 9/17 |
| 2006/0053904 | A1 * | 3/2006 | Sugiura | G01L 1/26 73/862.623 |
| 2007/0001556 | A1 * | 1/2007 | Nitto | H01L 41/0471 310/366 |
| 2010/0168583 | A1 | 7/2010 | Dausch et al. | |
| 2012/0105333 | A1 | 5/2012 | Maschmeyer et al. | |
| 2013/0334929 | A1 * | 12/2013 | Kuypers | H01L 41/09 310/321 |
| 2014/0197936 | A1 | 7/2014 | Biggs et al. | |
| 2015/0109223 | A1 | 4/2015 | Kessler et al. | |
| 2015/0116205 | A1 | 4/2015 | Westerman et al. | |
| 2015/0130730 | A1 | 5/2015 | Harley et al. | |
| 2016/0306423 | A1 | 10/2016 | Uttermann et al. | |
| 2017/0214384 | A1 * | 7/2017 | Bhattacharjee | H03H 9/02787 |
| 2017/0214385 | A1 * | 7/2017 | Bhattacharjee | H03H 9/02787 |

FOREIGN PATENT DOCUMENTS

| | | |
|---|---|---|
| WO | 2013169305 A1 | 11/2013 |
| WO | 2013170099 A1 | 11/2013 |
| WO | 2013188307 A2 | 12/2013 |
| WO | 2014018111 A1 | 1/2014 |
| WO | 2015020663 A1 | 2/2015 |

* cited by examiner

ELECTRONIC DEVICE INCLUDING PIEZOELECTRIC MATERIAL LAYER AND TEMPERATURE COMPENSATION CIRCUITRY AND RELATED METHODS

RELATED APPLICATIONS

The present application claims the priority benefit of provisional application Ser. No. 62/472,252 filed on Mar. 16, 2017, the entire contents of which are herein incorporated in its entirety by reference.

TECHNICAL FIELD

The present disclosure relates to the field of electronics, and, more particularly, to the field of haptics.

BACKGROUND

Haptic technology is becoming a more popular way of conveying information to a user. Haptic technology, which may simply be referred to as haptics, is a tactile feedback based technology that stimulates a user's sense of touch by imparting relative amounts of force to the user.

A haptic device or haptic actuator is an example of a device that provides the tactile feedback to the user. In particular, the haptic device or actuator may apply relative amounts of force to a user through actuation of a mass that is part of the haptic device. Through various forms of tactile feedback, for example, generated relatively long and short bursts of force or vibrations, information may be conveyed to the user.

SUMMARY

An electronic device may include a beam layer, a piezoelectric material layer coupled to the beam layer, and a temperature sensor adjacent the piezoelectric material layer. The electronic device may also include drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer. The high frequency drive signal may have a higher frequency than the low frequency drive signal. The electronic device may also include readout circuitry coupled to the piezoelectric material layer and configured to generate a sensed pressure value based upon the high frequency drive signal. Temperature compensation circuitry may cooperate with the readout circuitry to compensate the sensed pressure value based upon the temperature sensor.

The temperature sensor may include an electronic temperature sensor, for example. The electronic device may also include a plurality of electrodes coupled to the piezoelectric material layer and the drive circuitry and the readout circuitry.

The piezoelectric material layer may have a top and bottom, and the plurality of electrodes may be carried by the top and bottom. The plurality of electrodes may extend vertically within the piezoelectric material layer, for example.

The electronic device may also include an adhesive material layer coupled between the beam layer and the piezoelectric material layer, for example. The low frequency drive signal may be less than 1 kHz. The high frequency drive signal may be greater than 100 kHz, for example.

A method aspect is directed to a method of using an electronic device comprising a beam layer, a piezoelectric material layer coupled to the beam layer, and a temperature sensor adjacent the piezoelectric material layer. The method may include using drive circuitry coupled to the piezoelectric material layer to drive the piezoelectric material layer with a low frequency drive signal for actuating the piezoelectric material layer, and a high frequency drive signal for sensing a pressure applied to the piezoelectric material layer. The high frequency drive signal may have a higher frequency than the low frequency drive signal. The method may also include using readout circuitry coupled to the piezoelectric material layer to generate a sensed pressure value based upon the high frequency drive signal, and using temperature compensation circuitry to cooperate with the readout circuitry to compensate the sensed pressure value based upon the temperature sensor.

Another aspect is directed to an electronic device that may include a beam layer, a piezoelectric material layer coupled to the beam layer and having at least one temperature dependent characteristic associated therewith, and drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer. The high frequency drive signal may have a higher frequency than the low frequency drive signal. The electronic device may also include readout circuitry coupled to the piezoelectric material layer and configured to generate a sensed pressure value based upon the high frequency drive signal. Temperature compensation circuitry may cooperate with the readout circuitry to compensate the sensed pressure value based upon the at least one temperature dependent characteristic.

A related method is directed to a method of using an electronic device that includes a beam layer and a piezoelectric material layer coupled to the beam layer. The piezoelectric material layer may have at least one temperature dependent characteristic associated therewith. The method may include using drive circuitry coupled to the piezoelectric material layer to drive the piezoelectric material layer with a low frequency drive signal for actuating the piezoelectric material layer, and a high frequency drive signal for sensing a pressure applied to the piezoelectric material layer. The high frequency drive signal may have a higher frequency than the low frequency drive signal. The method may also include using readout circuitry coupled to the piezoelectric material layer to generate a sensed pressure value based upon the high frequency drive signal, and using temperature compensation circuitry to cooperate with the readout circuitry to compensate the sensed pressure value based upon the at least one temperature dependent characteristic.

Another aspect is directed to an electronic device that may include a beam layer having a top and bottom, a first piezoelectric material layer coupled to the top of the beam layer, and a second piezoelectric material layer coupled to the bottom of the beam layer. The electronic device may also include drive circuitry coupled to the first and second piezoelectric material layers and configured to drive the first and second piezoelectric material layers with a low frequency drive signal for actuating the first and second piezoelectric material layers, and a high frequency drive signal for sensing respective first and second pressures applied to the first and second piezoelectric material layers. The high frequency drive signal may have a higher frequency than the low frequency drive signal. The electronic device may also include readout circuitry coupled to the first and second piezoelectric material layers and configured to generate first and second sensed pressure values based upon the high frequency drive signal, and determine an overall sensed pressure value based upon the first and second sensed pressure values. The electronic device may also include temperature compensation circuitry cooperating with the readout circuitry to compensate the overall sensed pressure value based upon the first and second sensed pressure values.

A related method is directed to a method of using an electronic device that includes a beam layer having a top and bottom, a first piezoelectric material layer coupled to the top of the beam layer, and a second piezoelectric material layer coupled to the bottom of the beam layer. The method may include using drive circuitry coupled to the first and second piezoelectric material layers to drive the first and second piezoelectric material layers with a low frequency drive signal for actuating the first and second piezoelectric material layers, and a high frequency drive signal for sensing respective first and second pressures applied to the first and second piezoelectric material layers. The high frequency drive signal may have a higher frequency than the low frequency drive signal. The method may further include using readout circuitry coupled to the first and second piezoelectric material layers to generate first and second sensed pressure values based upon the high frequency drive signal, and determine an overall sensed pressure value based upon the first and second sensed pressure values. The method may also include using temperature compensation circuitry to cooperate with the readout circuitry to compensate the overall sensed pressure value based upon the first and second sensed pressure values.

Another aspect is directed to an electronic device that may include a beam layer, a first piezoelectric material layer coupled to the beam layer, and a second piezoelectric material layer coupled to the first piezoelectric material layer on a surface thereof opposite of the beam layer. The electronic device may also include drive circuitry coupled to the first and second piezoelectric material layers and configured to drive the first and second piezoelectric material layers with a low frequency drive signal for actuating the first and second piezoelectric material layers and a high frequency drive signal for sensing respective first and second pressures applied to the first and second piezoelectric material layers. The high frequency drive signal may have a higher frequency than the low frequency drive signal. The electronic device may also include readout circuitry coupled to the first and second piezoelectric material layers and configured to generate first and second sensed pressure values based upon the high frequency drive signal, and determine an overall sensed pressure value based upon the first and second sensed pressure values. Temperature compensation circuitry may cooperate with the readout circuitry to compensate the overall sensed pressure values based upon the first and second sensed pressure values.

A related method aspect is directed to a method of using an electronic device that includes a beam layer, a first piezoelectric material layer coupled to the beam layer, and a second piezoelectric material layer coupled to the first piezoelectric material layer on a surface thereof opposite of the beam layer. The method may include using drive circuitry coupled to the first and second piezoelectric material layers to drive the first and second piezoelectric material layers with a low frequency drive signal for actuating the first and second piezoelectric material layers and a high frequency drive signal for sensing respective first and second pressures applied to the first and second piezoelectric material layers. The high frequency drive signal may have a higher frequency than the low frequency drive signal. The method may further include using readout circuitry coupled to the first and second piezoelectric material layers to generate first and second sensed pressure values based upon the high frequency drive signal, and determine an overall sensed pressure value based upon the first and second sensed pressure values, and using temperature compensation circuitry to cooperate with the readout circuitry to compensate the overall sensed pressure values based upon the first and second sensed pressure values.

Another device aspect is directed to an electronic device that may include a beam layer, and a piezoelectric material layer that may include a first piezoelectric material body coupled to the beam layer, and at least one second piezoelectric material body coupled to and laterally adjacent the first piezoelectric material body and spaced from the beam layer. The electronic device may also include drive circuitry coupled to the first and at least one second piezoelectric material bodies and configured to drive the first and at least one second piezoelectric material bodies with a low frequency drive signal for actuating the first and at least one second piezoelectric material bodies and a high frequency drive signal for sensing respective first and at least one second pressure applied to the first and at least one second piezoelectric bodies. The high frequency drive signal may have a higher frequency than the low frequency drive signal. The electronic device may further include readout circuitry coupled to the first and at least one second piezoelectric material bodies and configured to generate first and second sensed pressure values based upon the high frequency drive signal, and determine an overall sensed pressure value based upon the first and at least one second sensed pressure values. Temperature compensation circuitry may cooperate with the readout circuitry to compensate the overall sensed pressure value based upon the first and at least one second sensed pressure values.

A related method aspect is directed to a method of using an electronic device that includes a beam layer, a piezoelectric material layer that includes a first piezoelectric material body coupled to the beam layer, and at least one second piezoelectric material body coupled to and laterally adjacent the first piezoelectric material body and spaced from the beam layer. The method may include using drive circuitry coupled to the first and at least one second piezoelectric material bodies to drive the first and at least one second piezoelectric material bodies with a low frequency drive signal for actuating the first and at least one second piezoelectric material bodies and a high frequency drive signal for sensing respective first and at least one second pressures applied to the first and at least one second piezoelectric bodies. The high frequency drive signal may have a higher frequency than the low frequency drive signal. The method may further include using readout circuitry coupled to the first and at least one second piezoelectric material bodies to generate first and at least one second sensed pressure values based upon high frequency drive signal, and determine an overall sensed pressure value based upon the first and at least one second sensed pressure values. The method may also include using temperature compensation circuitry to cooperate with the readout circuitry to compensate the overall sensed pressure value based upon the first and at least one second sensed pressure values.

Another device aspect is directed to an electronic device that may include a beam layer, a piezoelectric material layer coupled to the beam layer, and a plurality of spaced apart electrodes carried by the piezoelectric material layer defining a plurality of force pixels. The electronic device may further include drive circuitry coupled to the piezoelectric material layer and configured to drive the piezoelectric material layer with a low frequency drive signal for actuating the piezoelectric material layer and a high frequency drive signal for sensing a pressure applied to the piezoelectric material layer. The high frequency drive signal may have a higher frequency than the low frequency drive signal. The electronic device may also include readout circuitry coupled to the piezoelectric material layer and configured to generate a sensed pressure value based upon the high frequency drive signal. Temperature compensation circuitry may cooperate with the readout circuitry to compensate the sensed pressure value based upon the plurality of force pixels.

A related method aspect is directed to a method of using an electronic device that includes a beam layer, a piezoelectric material layer coupled to the beam layer, and a plurality of spaced apart electrodes carried by the piezoelectric material layer defining a plurality of force pixels. The method may include using drive circuitry coupled to the piezoelectric material layer to drive the piezoelectric material layer with a low frequency drive signal for actuating the piezoelectric material layer and a high frequency drive signal for sensing a pressure applied to the piezoelectric material layer. The high frequency drive signal may have a higher frequency than the low frequency drive signal. The method may further include using readout circuitry coupled to the piezoelectric material layer to generate a sensed pressure value based upon the high frequency drive signal, and using temperature compensation circuitry to cooperate with the readout circuitry to compensate the sensed pressure value based upon the plurality of force pixels.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
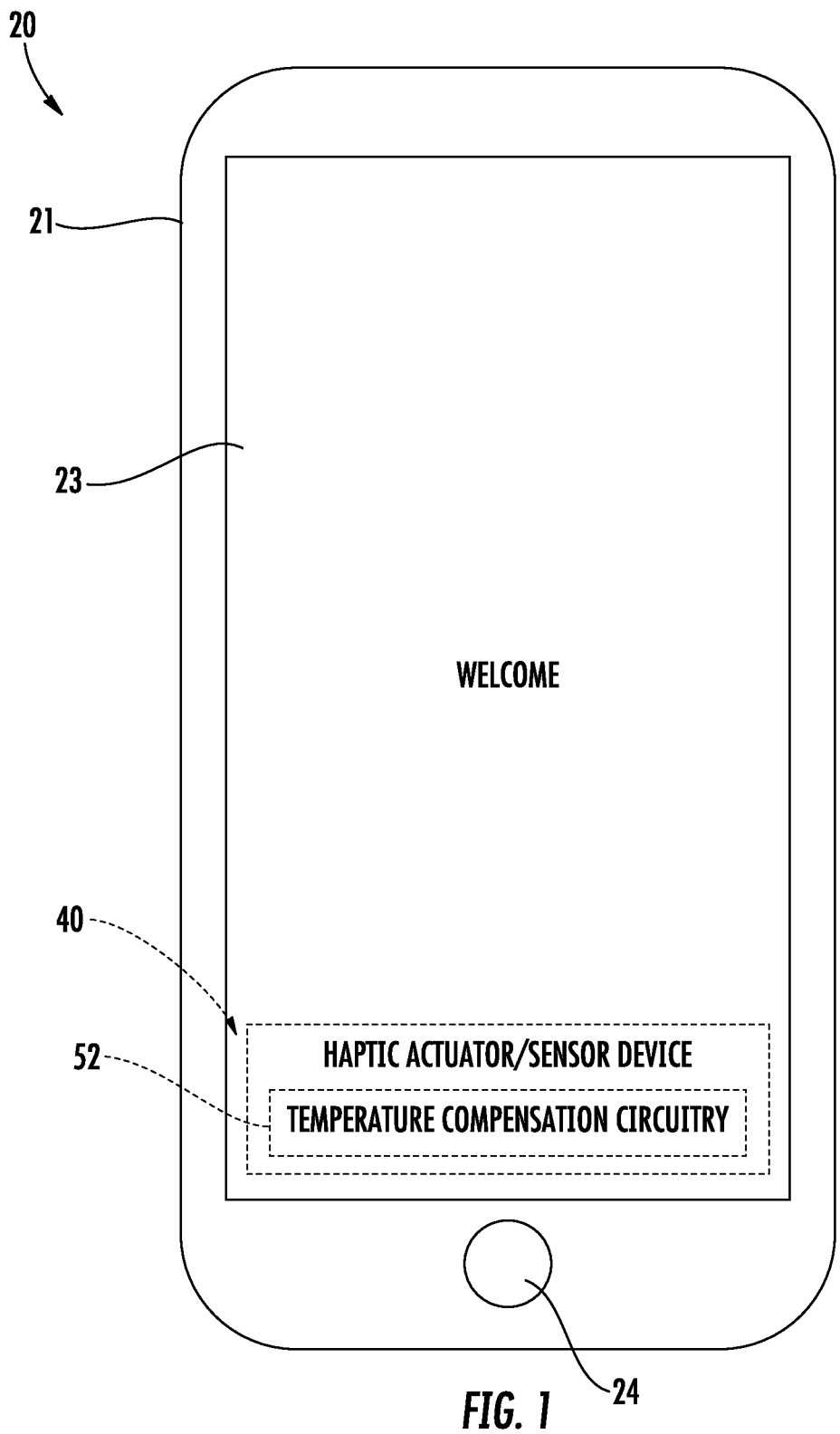
FIG. 1 is a perspective view of a mobile wireless communications device including an electronic device according to an embodiment.
Figure 2:
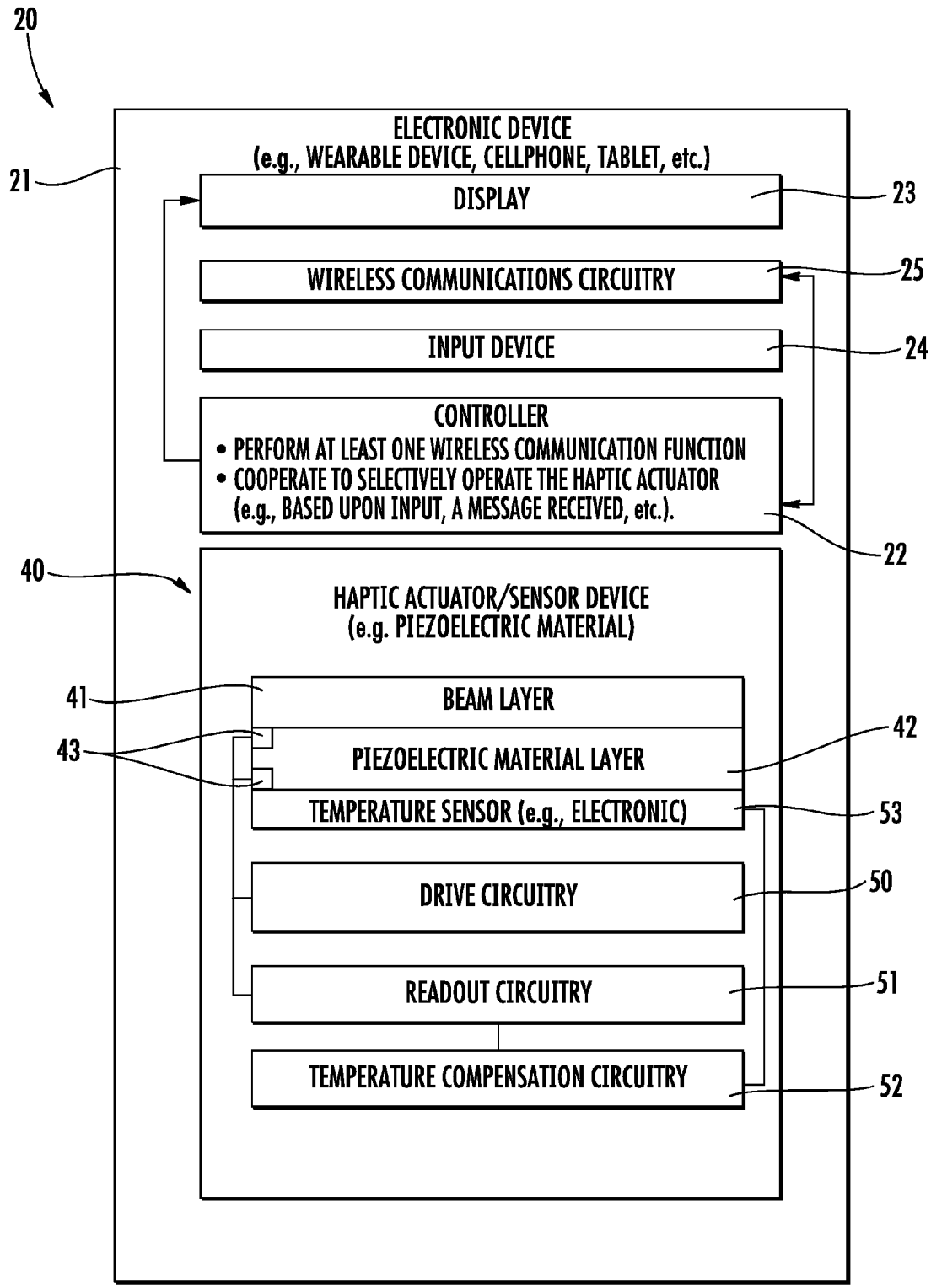
FIG. 2 is a schematic block diagram of the mobile wireless communications device of FIG. 1.

Referring initially to FIGS. 1 and 2, an electronic device 20 in the form of a mobile wireless communications device illustratively includes a device housing 21 and a controller 22 carried by the device housing. The electronic device 20 is illustratively a mobile telephone, for example, but may be another type of mobile wireless communications device, for example, a wearable wireless communications device that may include a band or strap for securing it to a user, a tablet computer, a laptop computer, etc.

Wireless communications circuitry 25 (e.g. cellular, WLAN Bluetooth, etc.) is also carried within the device housing 21 and coupled to the controller 22. The wireless communications circuitry 25 cooperates with the controller 22 to perform at least one wireless communications function, for example, for voice and/or data. In some embodiments, the electronic device 20 may not include wireless communications circuitry 25.

A display 23 is also carried by the device housing 21 and is coupled to the controller 22. The display 23 may be a light emitting diode (LED) display, for example, or may be another type of display, for example, a liquid crystal display (LCD) as will be appreciated by those skilled in the art.

A finger-operated user input device 24 illustratively in the form of a pushbutton switch is also carried by the device housing 21 and is coupled to the controller 22. The finger-operated input device 24 cooperates with the controller 22 to perform a device function in response to operation thereof. For example, a device function may include a powering on or off of the electronic device 20, initiating communication via the wireless communications circuitry 25, and/or performing a menu function. In some embodiments, the electronic device 20 may not include a pushbutton switch 24, as the finger-operated input device may be in another form, such as, for example, input from a touch display.

The controller cooperates, for example, with the display 23, finger-operated user input device 24, and/or wireless communications circuitry 25 to perform device functions. While a controller 22 is described, it should be understood that the controller 22 may include one or more of a processor and other circuitry to perform functions described herein, and some or all of the functions described herein, for example, as will be described in further detail below, may be incorporated in single processor or multiple processors and not embodied in separate or discrete components.

Figure 3:
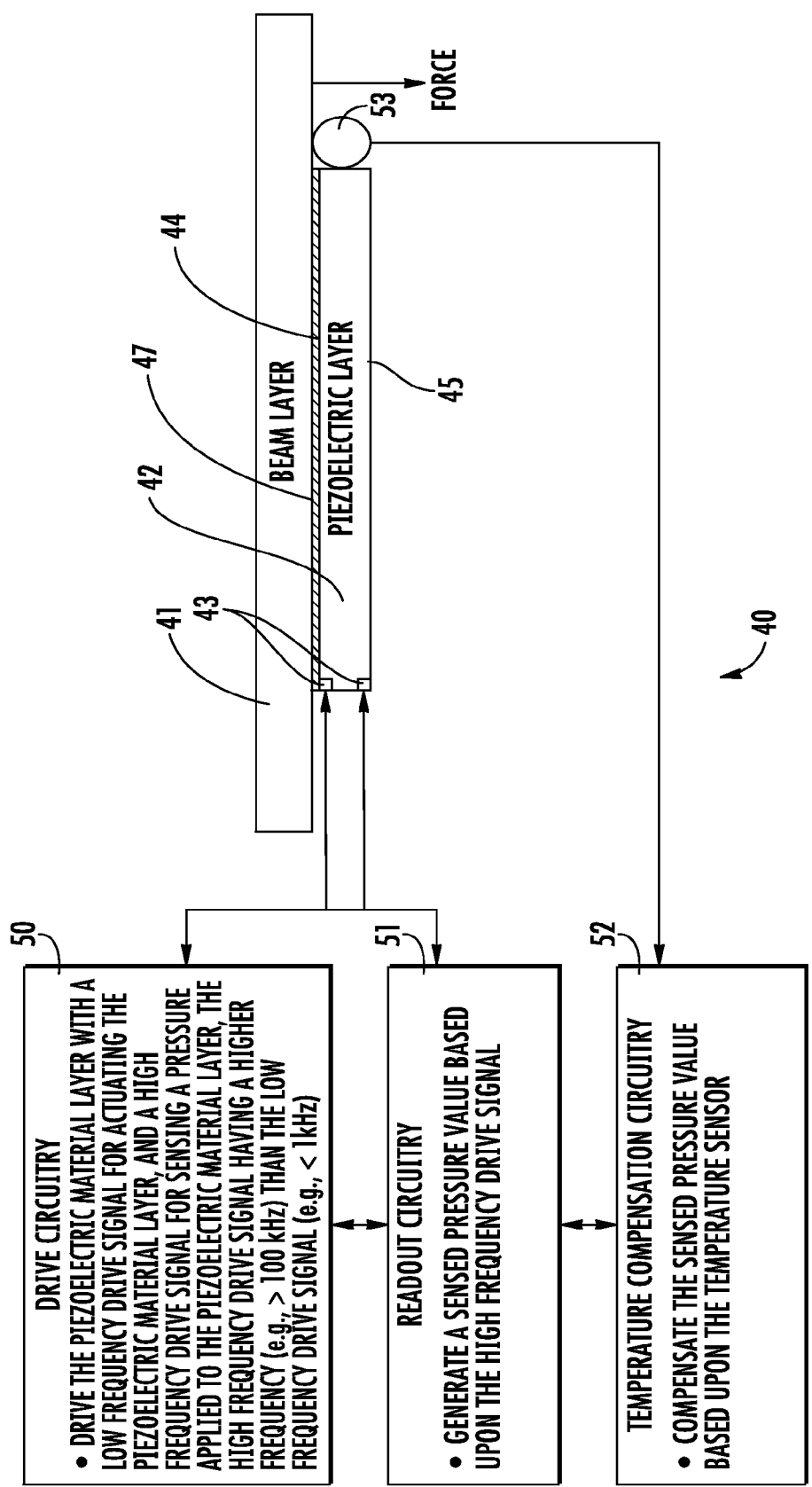
FIG. 3 is a more detailed schematic diagram of the haptic actuator/sensor device of FIG. 2.

Referring now additionally to FIG. 3, the mobile wireless communications device 20 illustratively includes an electronic device that is in the form of a haptic actuator/sensor device 40 (i.e., multifunction). The haptic actuator/sensor device 40 is coupled to the controller 22 and determines user indications and operates as a haptic actuator based upon the user indication. More particularly, the haptic actuator/sensor device 40 may cooperate with the controller 22 as a haptic actuator to provide haptic feedback to the user. The haptic feedback may be in the form of relatively long and short vibrations or "taps." The vibrations may be indicative of a message received, and the duration of the vibration may be indicative of the type of message received. Of course, the vibrations may be indicative of or convey other types of information.

The haptic actuator/sensor device 40 also operates as a pressure or force sensor. As a pressure sensor, the haptic actuator/sensor device 40 may cooperate with the controller 22 and determine an amount of pressure or force a user applies to the haptic actuator/sensor device, which may be particularly desirable for providing force or pressure based responses or functions, as will be appreciated by those skilled in the art.

Further details of the haptic actuator/sensor device 40 are now described. The haptic actuator/sensor device 40 includes a beam layer 41. The beam layer may 41 may include any material that resists loads, for example, provided thereto by a user or user's finger, and deflect by bending. The haptic actuator/sensor device 40 also includes a piezoelectric material layer 42 coupled to the beam layer 41 by way of an adhesive material layer 47 coupled between the beam layer and the piezoelectric material layer. Other techniques and/or materials may be used to couple the beam layer 41 to the piezoelectric material layer 42.

Piezoelectric materials may be particularly useful because of coupling between the electrical and mechanical domains, for example. When the piezoelectric material is deformed, its electrical properties change, and when its electrical properties are changed, it deforms. These properties may make the use of piezoelectric material to be advantageous for use as a dual mode haptic feedback and pressuring sensing device, such as, for example, the haptic actuator/sensor device 40.

Drive circuitry 50 is coupled to the piezoelectric material layer 42. The drive circuitry 50 is configured to drive the piezoelectric material layer 42 with a low frequency drive signal for actuating the piezoelectric material layer, and a high frequency drive signal for sensing a pressure applied to the piezoelectric material layer. The high frequency drive signal has a higher frequency than the low frequency drive signal. For example, the low frequency drive signal may be less than 1 kHz, and the high frequency drive signal may be greater than 100 kHz. Of course, the low and high frequency drive signals may be another frequency or frequency range, for example, and/or may include 1 kHZ and 100 kHz, respectively.

Readout circuitry 51 is coupled to the piezoelectric material layer 42. The readout circuitry 51 generates a sensed pressure value based upon the high frequency drive signal.

Figure 4:
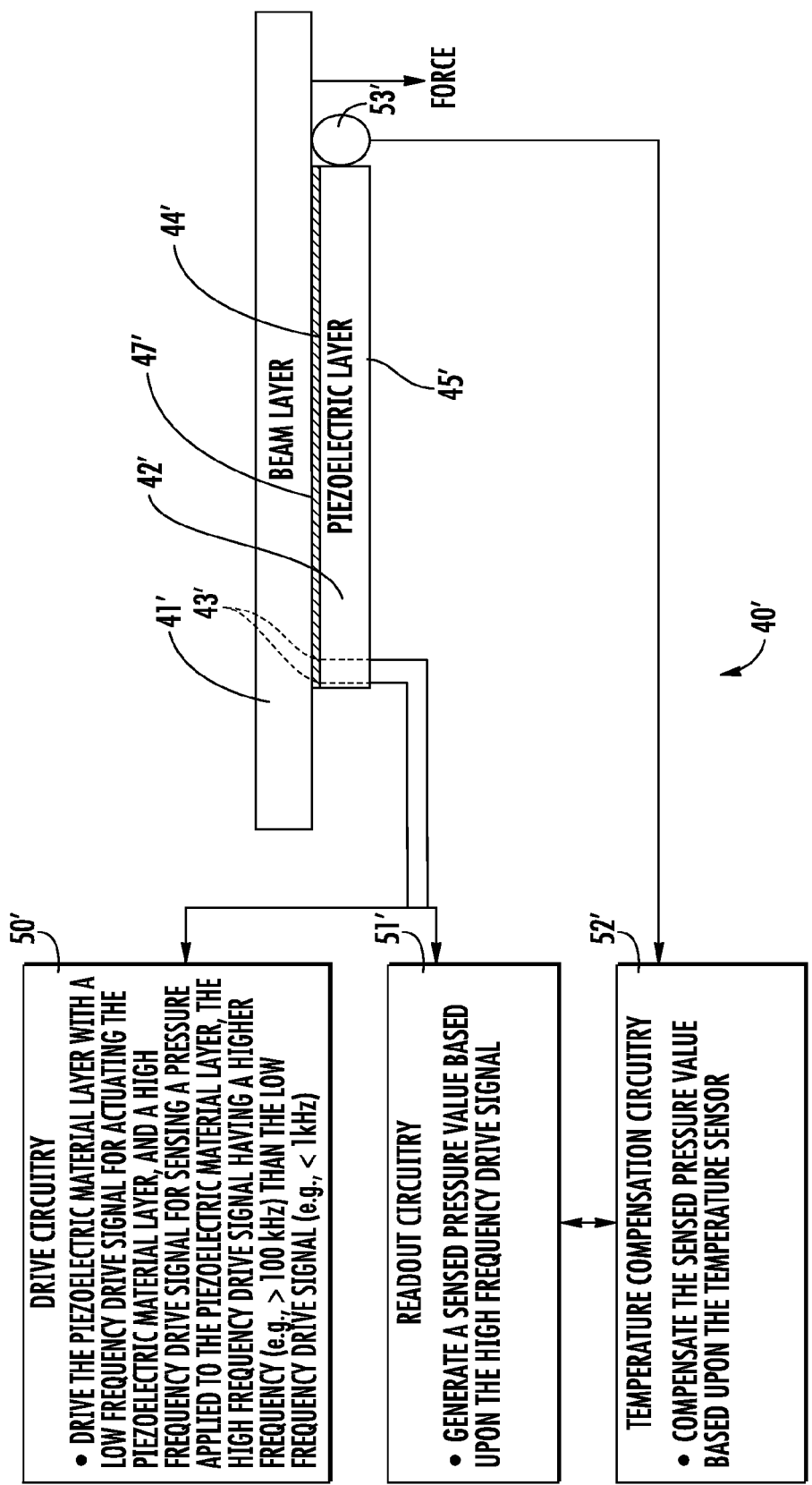
FIG. 4 is a schematic diagram of a haptic actuator/sensor device according to an embodiment.

The haptic actuator/sensor device 40 also includes electrodes 43 coupled to the piezoelectric material layer 41, the drive circuitry 50, and the readout circuitry 51. Illustratively, the electrodes 43 are carried by the top 44 and bottom 45 of the piezoelectric material layer 42. Since most tensile strain results in orthogonal compressive strain through the poisons ratio, the electrodes 43 may therefore be situated in any plane in exchange for some tradeoffs in signals and geometry, as will be appreciated by those skilled in the art. Referring briefly to FIG. 4, in another embodiment, the electrodes 43' extend vertically within the piezoelectric material layer 42'.

Referring again to FIGS. 1-3, for more accurate pressure sensing readings, and more particularly, a more accurate sensed pressure value, temperature compensation may be desirable. Accordingly, the haptic actuator/sensor device 40 also includes a temperature sensor 53, for example, an electronic temperature sensor (e.g., diode), adjacent the piezoelectric material layer 42. Temperature compensation circuitry 52 cooperates with the readout circuitry 51 to compensate the sensed pressure value based upon the temperature sensor 53.

As an actuator, the use of piezoelectric material may be relatively interesting. Generally speaking, if a voltage is applied the piezoelectric material grows, shrinks or, shears, for example. A power supply typically maintains the voltage relatively constant so the shape is maintained. However, when the piezoelectric material is used in the inverse, i.e., as a sensor, if a deformation is forced upon the piezoelectric material, the piezoelectric material generates a voltage, for example, that can then be read by a voltage sensor to sense the shape of the material, and ultimately generate a sensed pressure value.

Unfortunately, however, every real material (or material plus electronic reading system) typically has some finite resistance through which current will leak, draining the charge that the strain generated. This may result in the system voltage sagging over time, even when strain is applied continuously. The system therefore may only generate the high frequency component of the shape change you were try to sense.

One way to address this is through the use of a charge accumulator circuit to generally maintain the voltage at zero actively. However, the voltage, over time, drifts, which may further complicate accuracy. Accordingly, piezoelectric materials have generally been relegated to use as high frequency accelerometers or force sensors where the measurement of direct current (DC) signals may not be of particular interest.

Accordingly, the haptic actuator/sensor device 40 permits the measurement of DC signals. Piezoelectric materials by their function also have a very high dielectric constant. Accordingly, piezoelectric materials may have a much higher capacitance than we would expect for normal materials, and that even though the piezoelectric material is relatively stiff (e.g. ceramic), its capacitance value changes more per force applied than expected because of this relatively high dielectric constant. Thus, if an alternating current (AC) voltage is applied to the piezoelectric material, the current therethrough may vary in a meaningful way with the changing capacitance that results from the force.

While some systems, for example, may use a generally soft piezoelectric material for the sake of sensitivity, the softness may be traded for dielectric constant. This has an inherent value that provides a generally useful force measurement, even from a much stiffer system (e.g. a touch screen, finger-operated input device, metal housing, etc.)

Since the capacitive sensing is done based upon a high frequency drive signal, it may be separated from a low frequency drive signal and/or other low frequency signals, for example, those used for actuation. Using a low pass filter for the actuation line and a high-pass filter for the sensing line, the same material may be used for both actuation or driving and sensing concurrently. Of course, the actuation and sensing operations may be performed in alternating or a time division multiplexed fashion. Furthermore, by monitoring the charge back into the haptic actuator/sensor device 40, both the passive sensing charge output of the sensing (e.g., the sensing mode) at low frequencies where a human signal would be expected as well, and use the high frequency active readout to make a hybrid system using the signals that may be considered best for any given scenario or frequency may be tracked.

As will be appreciated by those skilled in the art, there may be cross coupling between the systems, i.e. the sensor's gain will have a dependence on the drive voltage due to electrostatic stiffening. However, since the shape and voltage applied are both known, a hybrid system can be formed to calibrate for or remove the cross-coupling, and generally choose either higher accuracy, better resolution, lower power etc.

The standard sensing mode may also be improved by having the capability to do a DC reference check to verify the magnitude of current leakage when charged to understand the loss of information experienced with what may be considered a traditional sensing mode. It may be likely that there may be improved performance or power trade-off with both sensing systems, how and when to use each to make a sensor fusion system may be chosen.

A variant may also time share the use of the device if preferred, for example, for integration reasons. A relatively high enough frequency may be used as long as the time share occurs at a high enough frequency that is desirable not to be noticed by a user. However, for example, if the signal is higher than the resonant frequency, there may be no or zero mechanical response. Thus, it may be desirable to perform a sensing operation without actively discharging the actuation charge (e.g., disconnecting the power source without shorting it) because that may reduce the power from the drive electronics for relatively quick recharging, which may be inherently limited in human safe piezo drives. Indeed, the present system or haptic actuator/sensor device 40 generally operates all at once, but separated in the frequency domain.

A method aspect is directed to a method of using an electronic device in the form of a haptic actuator/sensor device 40 that includes a beam layer 41, a piezoelectric material layer 42 coupled to the beam layer 41, and a temperature sensor 53 adjacent the piezoelectric material layer. The method includes using drive circuitry 50 coupled to the piezoelectric material layer 42 to drive the piezoelectric material layer with a low frequency drive signal for actuating the piezoelectric material layer, and a high frequency drive signal for sensing a pressure applied to the piezoelectric material layer. The high frequency drive signal may have a higher frequency than the low frequency drive signal. The method also includes using readout circuitry 51 coupled to the piezoelectric material layer to generate a sensed pressure value based upon the high frequency drive signal, and using temperature compensation circuitry 52 to cooperate with the readout circuitry to compensate the sensed pressure value based upon the temperature sensor.

Figure 5:
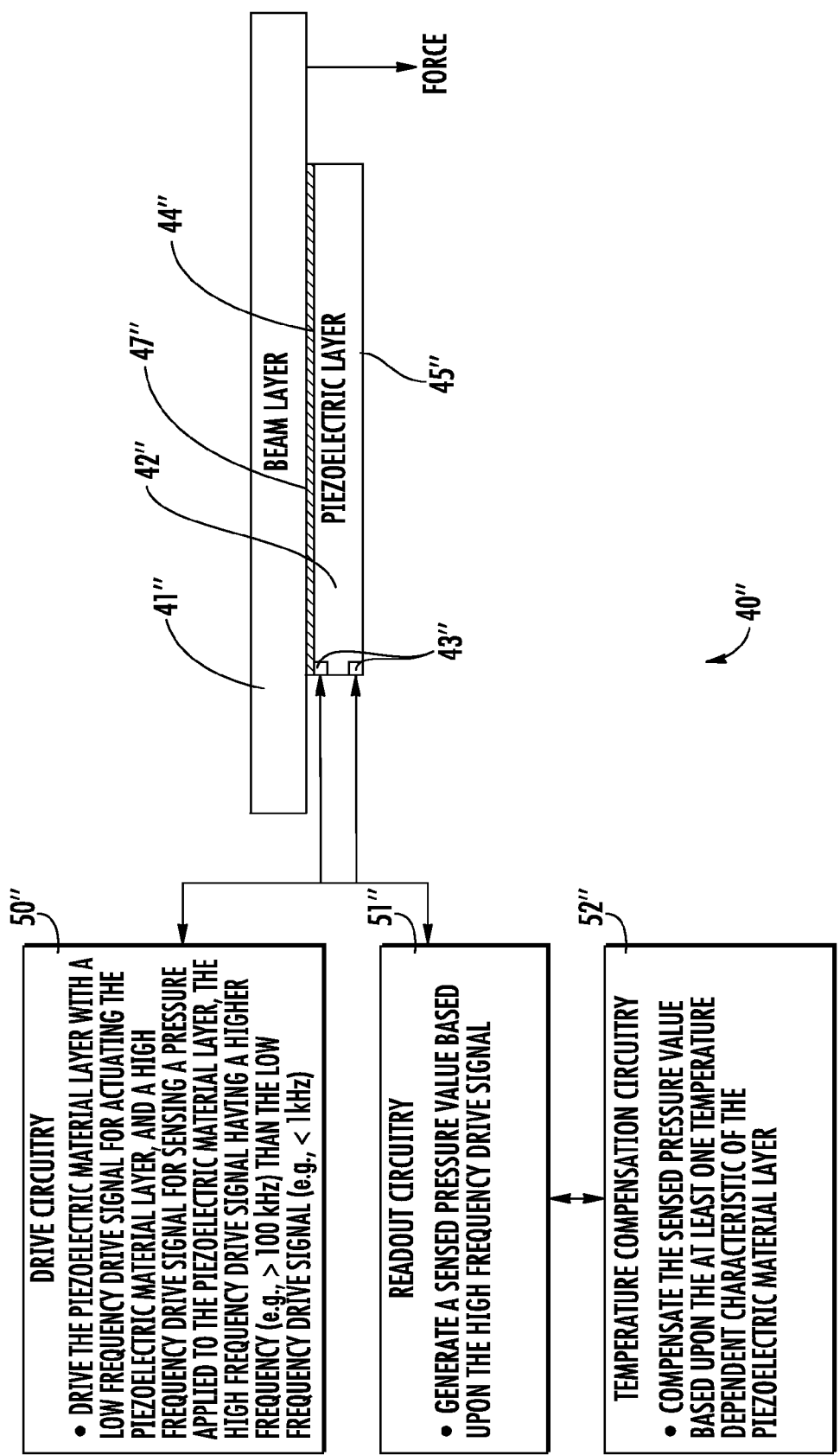
FIG. 5 is a schematic diagram of a haptic actuator/sensor device according to an embodiment.

Referring now to FIG. 5, in another embodiment, the piezoelectric material layer 42" has a temperature dependent characteristic associated therewith. The piezoelectric material layer 42" may have more than one temperature dependent characteristic associated therewith. The temperature dependent characteristic may include any one or more of resistance, bulk resistivity, and resonant frequency, for example. The temperature compensation circuitry 52" cooperates with the readout circuitry 51" to compensate the sensed pressure value, generated from the readout circuitry, based upon the temperature dependent characteristic or characteristics. For example, an electrode film may have a resistance that changes with temperature, or with stiffness, and thus, resonant frequency of the haptic actuator/sensor device 40". Elements illustrated with respect to the present embodiment, but not specifically described herein are similar to those described above.

A related method aspect is directed to a method of using a haptic actuator/sensor device 40". The haptic actuator/sensor device 40" includes a beam layer 41" and a piezoelectric material layer 42" coupled to the beam layer. The piezoelectric material layer 42" has at least one temperature dependent characteristic associated therewith. The method includes using drive circuitry 50" coupled to the piezoelectric material layer 42" to drive the piezoelectric material layer with a low frequency drive signal for actuating the piezoelectric material layer, and a high frequency drive signal for sensing a pressure applied to the piezoelectric material layer. The high frequency drive signal has a higher frequency than the low frequency drive signal. The method also includes using readout circuitry 51" coupled to the piezoelectric material layer 42" to generate a sensed pressure value based upon the high frequency drive signal, and using temperature compensation circuitry 52" to cooperate with the readout circuitry to compensate the sensed pressure value based upon the at least one temperature dependent characteristic.

Figure 6:
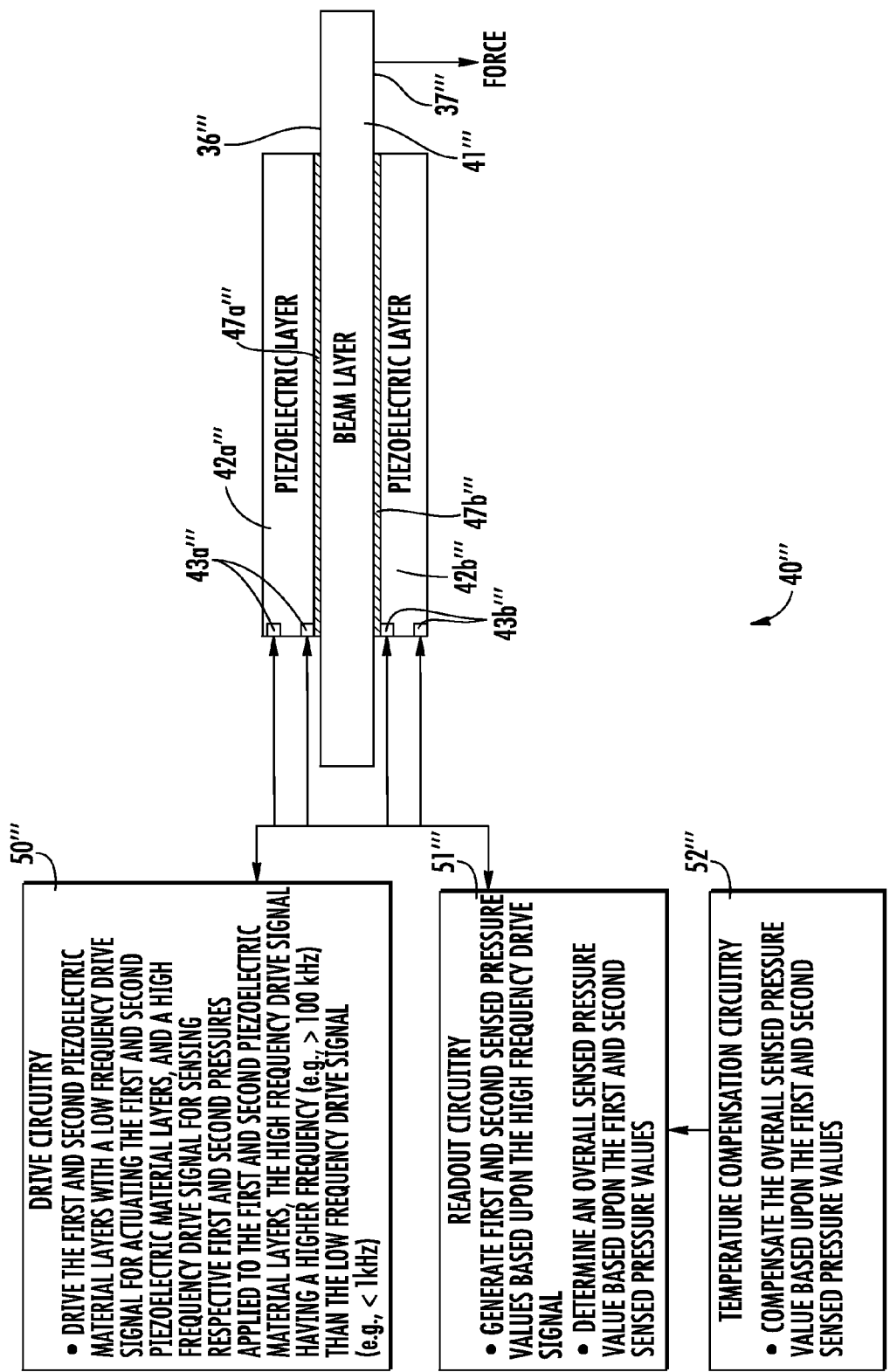
FIG. 6 is a schematic diagram of a haptic actuator/sensor device according to an embodiment.

Referring now to FIG. 6, in another embodiment of the haptic actuator/sensor device 40''', temperature compensation may be performed through symmetry and tensile strain. The beam layer 41''' has a top 36''' and a bottom 37'''. A first piezoelectric material layer 42a''' is coupled to the top 36''' of the beam layer 41''', and a second piezoelectric material layer 42b''' is coupled to the bottom 37''' of the beam layer. Drive circuitry 50''' is coupled to the first and second piezoelectric material layers 42a''', 42b''', for example, by way of respective electrodes 43a''', 43b'''. A first adhesive material layer 47a''' is coupled between the beam layer 41''' and the first piezoelectric material layer 42a''' and a second adhesive material layer 47b''' is coupled between the beam layer and the second piezoelectric material layer 42b'''.

The readout circuitry 51''' is coupled to the first and second piezoelectric material layers 42a''', 42b''' and generates first and second sensed pressure values based upon the high frequency drive signal, and determines an overall sensed pressure value based upon the first and second sensed pressure values. The temperature compensation circuitry 52''' cooperates with the readout circuitry 51''' to compensate the overall sensed pressure value based upon the first and second sensed pressure values.

More particularly, conceptually, the top side of a cantilever may be considered the positive side of a differential signal with the bottom being the negative. Temperature should be well coupled (provided first and second piezoelectric layers 42a''', 42b''' are not actively heated faster than their coupled thermal time constants). While this approach may provide relatively accurate results, it may be desirable to have the top of the beam layer 41''' carry or be coupled to a layer other than a piezoelectric material layer (e.g., an LCD screen, glass, etc.). Elements illustrated with respect to the present embodiment, but not specifically described herein are similar to those described above.

A related method aspect is directed to a method of using a haptic actuator/sensor device 40''' that includes a beam layer 41''' having a top 36''' and bottom 37''', a first piezoelectric material layer 42a''' coupled to the top of the beam layer, and a second piezoelectric material layer 42b''' coupled to the bottom of the beam layer. The method may include using drive circuitry 50''' coupled to the first and second piezoelectric material layers 42a''', 42b''' to drive the first and second piezoelectric material layers with a low frequency drive signal for actuating the first and second piezoelectric material layers, and a high frequency drive signal for sensing respective first and second pressures applied to the first and second piezoelectric material layers. The high frequency drive signal may have a higher frequency than the low frequency drive signal. The method may further include using readout circuitry 51''' coupled to the first and second piezoelectric material layers 42a''', 42b''' to generate first and second sensed pressure values based upon the high frequency drive signal, and determine an overall sensed pressure value based upon the first and second sensed pressure values. The method may also include using temperature compensation circuitry 52''' to cooperate with the readout circuitry 51′′′′ to compensate the overall sensed pressure value based upon the first and second sensed pressure values.

Figure 7:
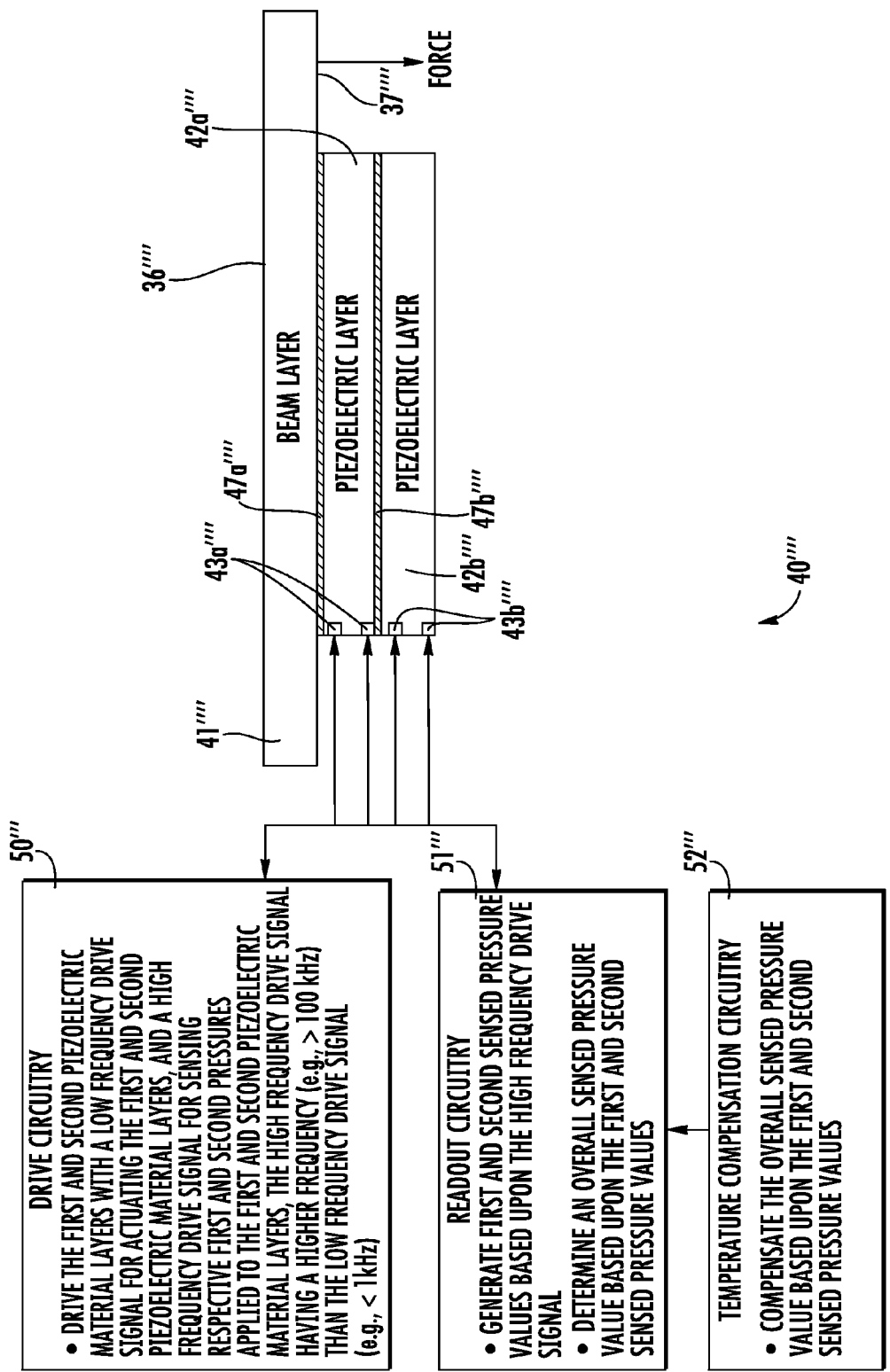
FIG. 7 is a schematic diagram of a haptic actuator/sensor device according to an embodiment.

Referring now to FIG. 7, in another embodiment temperature compensation is performed through signal sacrifice. A first piezoelectric material layer 42a′′′′ is coupled to the beam layer 41′′′′, and more particularly, a bottom side 37′′′′, and a second piezoelectric material layer 42b′′′′ is coupled to the first piezoelectric material layer in a stacked arrangement, or more particularly, to a surface of the first piezoelectric material layer opposite of the beam layer. Drive circuitry 50′′′′ is coupled to the first and second piezoelectric material layers 42a′′′′, 42b′′′′, for example, by way of respective electrodes 43a′′′′, 43b′′′′. In some embodiments, the first and second piezoelectric material layers 42′′′′, 42b′′′′ may be carried by or coupled to the top 36′′′′ of the beam layer 41′′′′. The readout circuitry 51′′′′ is coupled to the first and second piezoelectric material layers 42a′′′′, 42b′′′′ and generates first and second sensed pressure values based upon the high frequency drive signal and determines an overall sensed pressure value based upon the first and second sensed pressure values. The temperature compensation circuitry 52′′′′ cooperates with the readout circuitry 51′′′′ to compensate the overall sensed pressure values based upon the first and second sensed pressure values.

As will be appreciated by those skilled in the art, one approach to address the desire to have the top of the beam layer without a piezoelectric material layer is to sacrifice some signal for that flexibility. Accordingly, the first and second piezoelectric material layers 42a′′′′, 42b′′′′ are different distances from the neutral axis. Elements illustrated with respect to the present embodiment, but not specifically described herein are similar to those described above.

A related method aspect is directed to a method of using a haptic actuator/sensor device 40′′′′ that includes a beam layer 41′′′′, a first piezoelectric material layer 42a′′′′ coupled to the beam layer, and a second piezoelectric material layer 42b′′′′ coupled to the first piezoelectric material layer on a surface thereof opposite of the beam layer. The method may include using drive circuitry 50′′′′ coupled to the first and second piezoelectric material layers 42a′′′′, 42b′′′′ to drive the first and second piezoelectric material layers with a low frequency drive signal for actuating the first and second piezoelectric material layers and a high frequency drive signal for sensing respective first and second pressures applied to the first and second piezoelectric material layers. The high frequency drive signal may have a higher frequency than the low frequency drive signal. The method may further include using readout circuitry 51′′′′ coupled to the first and second piezoelectric material layers 42a′′′′, 42b′′′′ to generate first and second sensed pressure values based upon the high frequency drive signal, and determine an overall sensed pressure value based upon the first and second sensed pressure values, and using temperature compensation circuitry 52′′′′ to cooperate with the readout circuitry to compensate the overall sensed pressure values based upon the first and second sensed pressure values.

Figure 8:
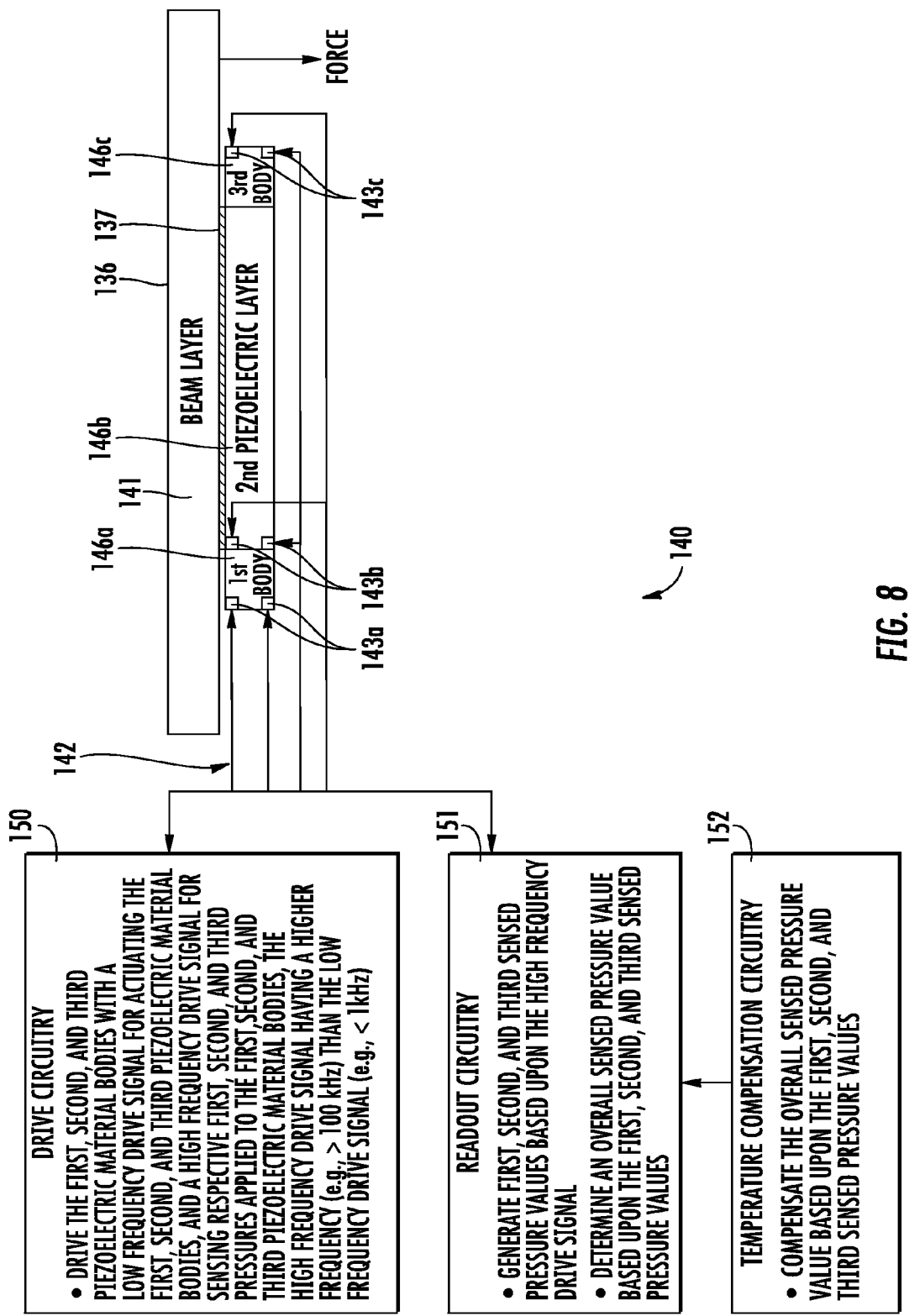
FIG. 8 is a schematic diagram of a haptic actuator/sensor device according to an embodiment.

Referring now to FIG. 8, in another embodiment, temperature compensation is performed through an "uncoupled tab." The haptic actuator/sensor device 140 includes a piezoelectric material layer 142 that includes a first piezoelectric material body 146a coupled to the beam layer 141 (e.g., a bottom 137 of the beam layer), a second piezoelectric material body 146b coupled to and laterally adjacent the first piezoelectric material body and spaced from the beam layer, and a third piezoelectric material body 146c coupled to and laterally adjacent the first piezoelectric material body and spaced from the beam layer. Of course, in some embodiments, the piezoelectric material bodies 146a-146c may be carried by the top of the beam layer 141.

Drive circuitry 150 is coupled to the first, second, and third piezoelectric material bodies 146a-146c and drives the first, second, and third piezoelectric material bodies with a low frequency drive signal for actuating the piezoelectric material layer and a high frequency drive signal for sensing a pressure thereto. The high frequency drive signal having a higher frequency than the low frequency drive signal. Readout circuitry 151 is coupled to the first, second, and third piezoelectric material bodies 146a-146c and generates first, second, and third sensed pressure values based upon the high frequency drive signal, and determines an overall sensed pressure value based upon the first, second, and third sensed pressure values. The temperature compensation circuitry 152 cooperates with the readout circuitry to compensate the overall sensed pressure value based upon the first, second, and third sensed pressure values.

By bonding only a portion of the piezoelectric material, areas will be well thermally coupled to the sensing area, but may not experience the same strain. Different regions may be made into different sensors through patterning, for example. As long as the areas are the same, for example, in size, the temperature is cancelled, but there will not generally be a loss of signal. As will be appreciated by those skilled in the art, the exact areas of bonding may be chosen by making the beam have a proud region for bonding. Elements illustrated with respect to the present, embodiment, but not specifically described herein are similar to those described above.

A related method aspect is directed to a method of using a haptic actuator/sensor device 140 that includes a beam layer 141, a piezoelectric material layer 142 that includes a first piezoelectric material body 146a coupled to the beam layer, and at least one second piezoelectric material body 146b, 146c coupled to and laterally adjacent the first piezoelectric material body and spaced from the beam layer. The method includes using drive circuitry 150 coupled to the first and at least one second piezoelectric material bodies 146a-146c to drive the first and at least one second piezoelectric material bodies with a low frequency drive signal for actuating the first and at least one second piezoelectric material bodies and a high frequency drive signal for sensing respective first and at least one second pressures applied to the first and at least one second piezoelectric bodies. The high frequency drive signal may have a higher frequency than the low frequency drive signal. The method further includes using readout circuitry 151 coupled to the first and at least one second piezoelectric material bodies 146a-146c to generate first and at least one second sensed pressure values based upon high frequency drive signal, and determine an overall sensed pressure value based upon the first and at least one second sensed pressure values. The method also includes using temperature compensation circuitry 152 to cooperate with the readout circuitry 151 to compensate the overall sensed pressure value based upon the first and at least one second sensed pressure values.

Figure 9:
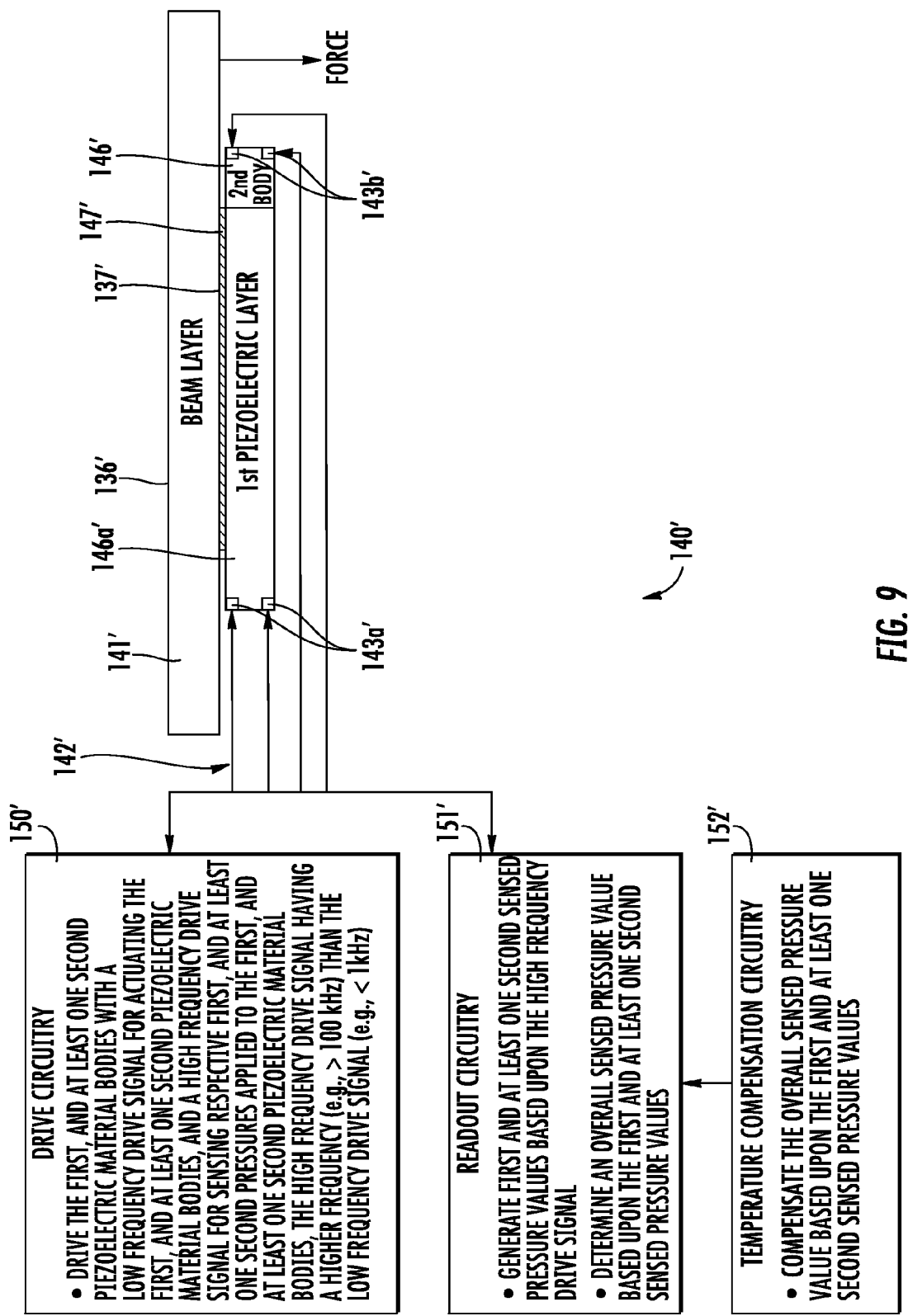
FIG. 9 is a schematic diagram of a haptic actuator/sensor device according to an embodiment.

Referring now to FIG. 9, in another embodiment, temperature compensation may also be performed through an "uncoupled tab." In the present embodiment, instead of second and third piezoelectric bodies, there may be only a second piezoelectric material body 146b′ laterally adjacent (e.g. to the left of or to the right of) the first piezoelectric material body 146a′.

Since it may be capacitance that is desirable to be matched between parts or elements of the differential, the amount of piezoelectric material wasted may be reduced on the differential side by making that area thinner provided there is relatively good thermal coupling. For example, if the gap or spacing between the second piezoelectric body 146b' and the beam layer 141' is reduced by half, the gap area may also be reduced to half resulting in four times less material. Additionally, in this case, it might be helpful to add a thermal conductive material in the space between the second piezoelectric body 146b' and the beam layer 141' to maintain temperatures as close as possible, but care should be taken that mismatched coefficient of thermal expansion (CTE) do not cause increased thermal drive. To address this, an insulative box may be used and positioned around the first and second piezoelectric bodies 146a', 146b'. Elements illustrated with respect to the present embodiment, but not specifically described herein are similar to those described above.

A related method aspect is directed to a method of using a haptic actuator/sensor device 140' that includes a beam layer 141', a piezoelectric material layer 142' that includes a first piezoelectric material body 146a' coupled to the beam layer, and a second piezoelectric material body 146b' coupled to and laterally adjacent the first piezoelectric material body and spaced from the beam layer. The method includes using drive circuitry 150' coupled to the first and at least one second piezoelectric material bodies 146a', 146b' to drive the first and at least one second piezoelectric material bodies with a low frequency drive signal for actuating the first and at least one second piezoelectric material bodies and a high frequency drive signal for sensing respective first and at least one second pressures applied to the first and at least one second piezoelectric bodies. The high frequency drive signal may have a higher frequency than the low frequency drive signal. The method further includes using readout circuitry 151' coupled to the first and at least one second piezoelectric material bodies 146a', 146b' to generate first and at least one second sensed pressure values based upon high frequency drive signal, and determine an overall sensed pressure value based upon the first and at least one second sensed pressure values. The method also includes using temperature compensation circuitry 152' to cooperate with the readout circuitry 151' to compensate the overall sensed pressure value based upon the first and at least one second sensed pressure values.

Figure 10:
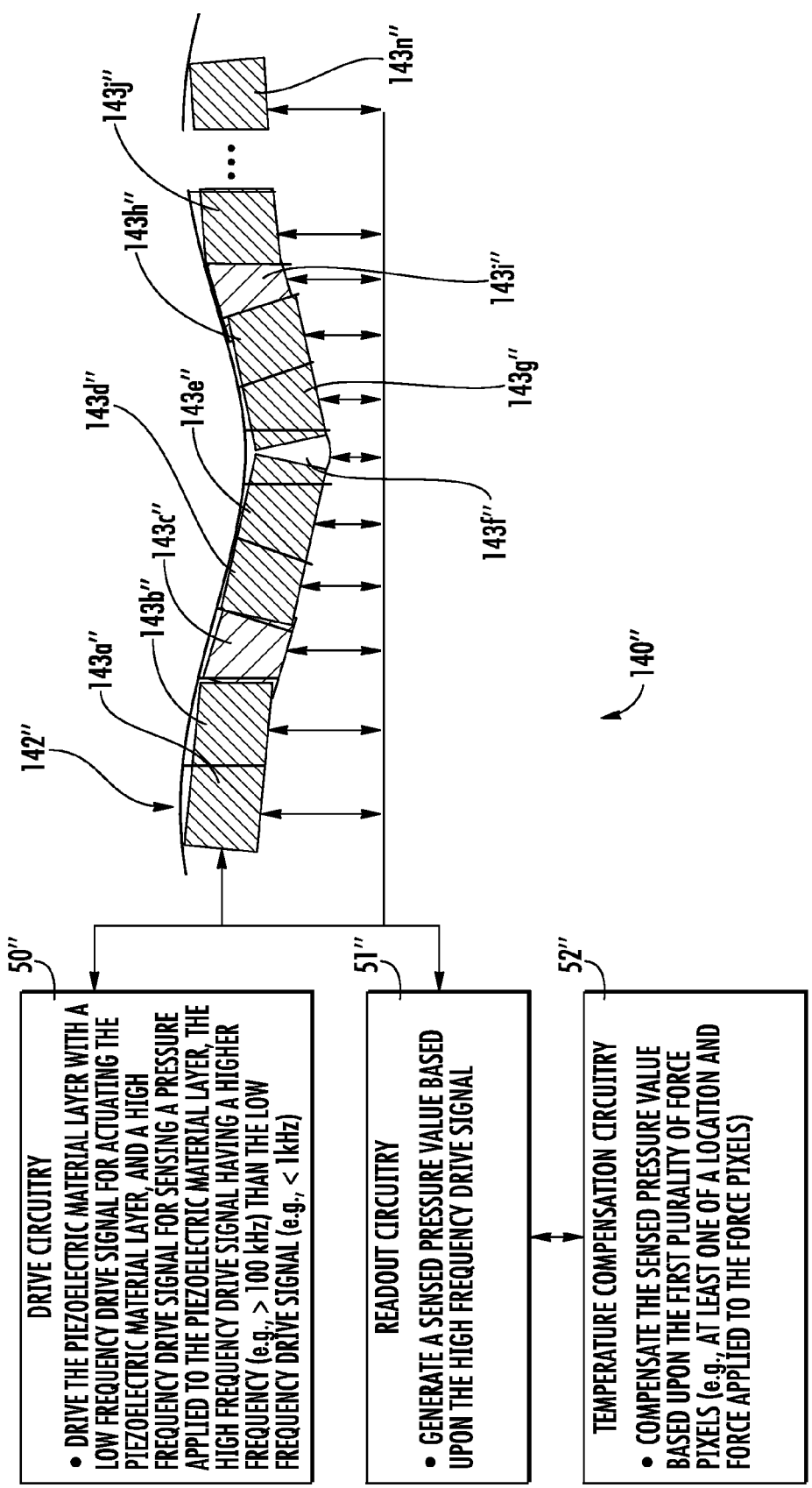
FIG. 10 is a schematic diagram of a haptic actuator/sensor device according to an embodiment.

Referring now to FIG. 10, in another embodiment to provide increased signal per piezoelectric material volume, situationally aware and digitally reconfigurable differential signals may be used. Spaced apart electrodes 143a"-143n" are carried by the piezoelectric material layer 142" defining a plurality of force pixels. The readout circuitry 151" is coupled to the piezoelectric material layer 142" and generates a sensed pressure value based upon the high frequency drive signal. The temperature compensation circuitry 152" cooperates with the readout circuitry 151" to compensate the sensed pressure value based upon the plurality of force pixels 143a"-143n", and more particularly, one or more of a location and sensed force (e.g., magnitude) of the force pixels.

As will be appreciated by those skilled in the art, if the location and size of the force from touch hardware is known, the "force pixels" may be digitally reassigned to be the plus and minus parts of a differential signal. The force pixels 143a"-143n" may include screen printed electrodes (or other patterning), but since the material itself is considered a solid block, the thermal coupling between the force pixels should be relatively strong making nearby force pixels an appropriate temperature reference for a differential signal. Elements illustrated with respect to the present embodiment, but not specifically described herein are similar to those described above.

A related method aspect is directed to a method of using a haptic actuator/sensor device 140" that includes a beam layer 141", a piezoelectric material layer 142" coupled to the beam layer, and a plurality of spaced apart electrodes 143a"-143n" carried by the piezoelectric material layer defining a plurality of force pixels. The method includes using drive circuitry 150" coupled to the piezoelectric material layer 142" to drive the piezoelectric material layer with a low frequency drive signal for actuating the piezoelectric material layer and a high frequency drive signal for sensing a pressure applied to the piezoelectric material layer. The high frequency drive signal may have a higher frequency than the low frequency drive signal. The method further includes using readout circuitry 151" coupled to the piezoelectric material layer 142" to generate a sensed pressure value based upon the high frequency drive signal, and using temperature compensation circuitry 152" to cooperate with the readout circuitry to compensate the sensed pressure value based upon the plurality of force pixels.

Elements described with respect to any single embodiment may be used and/or interchanged with elements and other embodiment or embodiments. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

An electronic device comprises a beam layer having a top and bottom, a first piezoelectric material layer coupled to the top of the beam layer, and a second piezoelectric material layer coupled to the bottom of the beam layer. The electronic device comprises drive circuitry coupled to the first and second piezoelectric material layers and configured to drive the first and second piezoelectric material layers with a low frequency drive signal for actuating the first and second piezoelectric material layers, and a high frequency drive signal for sensing respective first and second pressures applied to the first and second piezoelectric material layers, the high frequency drive signal having a higher frequency than the low frequency drive signal. The electronic device comprises readout circuitry coupled to the first and second piezoelectric material layers and configured to generate first and second sensed pressure values based upon high frequency drive signal, and determine an overall sensed pressure value based upon the first and second sensed pressure values. The electronic device comprises temperature compensation circuitry cooperating with the readout circuitry to compensate the overall sensed pressure value based upon the first and second sensed pressure values.

The electronic device further comprises a plurality of electrodes coupled to the first and second piezoelectric material layers, the drive circuitry, and the readout circuitry.

The first and second piezoelectric material layers each has a top and bottom and the plurality of electrodes are carried by the top and bottom.

The plurality of electrodes extend vertically within the first and second piezoelectric material layers.

The electronic device further comprises a first adhesive material layer coupled between the beam layer and the first piezoelectric material layer.

The electronic device further comprises a second adhesive material layer coupled between the beam layer and the second piezoelectric material layer.

The low frequency drive signal is less than 1 kHz.

The high frequency drive signal is greater than 100 kHz.

A mobile wireless communications device comprises a housing, wireless communications circuitry carried by the housing, and an electronic device carried by the housing. The electronic device comprises a beam layer having a top and bottom, a first piezoelectric material layer coupled to the top of the beam layer, a second piezoelectric material layer coupled to the bottom of the beam layer, and drive circuitry coupled to the first and second piezoelectric material layers and configured to drive the first and second piezoelectric material layers with a low frequency drive signal for actuating the first and second piezoelectric material layers, and a high frequency drive signal for sensing respective first and second pressures applied to the first and second piezoelectric material layers, the high frequency drive signal having a higher frequency than the low frequency drive signal. The electronic device comprises readout circuitry coupled to the first and second piezoelectric material layers and configured to generate first and second sensed pressure values based upon high frequency drive signal, and determine an overall sensed pressure value based upon the first and second sensed pressure values. The electronic device comprises temperature compensation circuitry cooperating with the readout circuitry to compensate the overall sensed pressure value based upon the first and second sensed pressure values. The mobile wireless communications device comprises a controller coupled to the wireless communications circuitry and the electronic device and configured to perform at least one wireless communications function and selectively operate the electronic device.

A method of using an electronic device comprising a beam layer having a top and bottom, a first piezoelectric material layer coupled to the top of the beam layer, and a second piezoelectric material layer coupled to the bottom of the beam layer comprises using drive circuitry coupled to the first and second piezoelectric material layers to drive the first and second piezoelectric material layers with a low frequency drive signal for actuating the first and second piezoelectric material layers, and a high frequency drive signal for sensing respective first and second pressures applied to the first and second piezoelectric material layers, the high frequency drive signal having a higher frequency than the low frequency drive signal. The method comprises using readout circuitry coupled to the first and second piezoelectric material layers to generate first and second sensed pressure values based upon high frequency drive signal, and determine an overall sensed pressure value based upon the first and second sensed pressure values. The method comprises using temperature compensation circuitry to cooperate with the readout circuitry to compensate the overall sensed pressure value based upon the first and second sensed pressure values.

An electronic device comprises a beam layer, a first piezoelectric material layer coupled to the beam layer, a second piezoelectric material layer coupled to the first piezoelectric material layer on a surface thereof opposite the beam layer, and drive circuitry coupled to the first and second piezoelectric material layers and configured to drive the first and second piezoelectric material layers with a low frequency drive signal for actuating the first and second piezoelectric material layers and a high frequency drive signal for sensing respective first and second pressures applied to the first and second piezoelectric material layers, the high frequency drive signal having a higher frequency than the low frequency drive signal. The electronic device comprises readout circuitry coupled to the first and second piezoelectric material layers and configured to generate first and second sensed pressure values based upon high frequency drive signal, and determine an overall sensed pressure value based upon the first and second sensed pressure values. The electronic device comprises temperature compensation circuitry cooperating with the readout circuitry to compensate the overall sensed pressure values based upon the first and second sensed pressure values.

The electronic device further comprises a plurality of electrodes coupled to the first and second piezoelectric material layers, the drive circuitry, and the readout circuitry.

The first and second piezoelectric material layers each has a top and bottom and the plurality of electrodes are carried by the top and bottom.

The plurality of electrodes extend vertically within the first and second piezoelectric material layers.

The electronic device further comprises a first adhesive material layer coupled between the beam layer and the first piezoelectric material layer.

The electronic device further comprises a second adhesive material layer coupled between the beam layer and the second piezoelectric material layer.

The low frequency drive signal is less than 1 kHz.

The high frequency drive signal is greater than 100 kHz.

A mobile wireless communications device comprises a housing, wireless communications circuitry carried by the housing, and an electronic device carried by the housing. The electronic device comprises a beam layer, a first piezoelectric material layer coupled to the beam layer, and a second piezoelectric material layer coupled to the first piezoelectric material layer on a surface thereof opposite of the beam layer. The electronic device comprises drive circuitry coupled to the first and second piezoelectric material layers and configured to drive the first and second piezoelectric material layer with a low frequency drive signal for actuating the first and second piezoelectric material layers and a high frequency drive signal for sensing respective first and second pressures applied to the first and second piezoelectric material layers, the high frequency drive signal having a higher frequency than the low frequency drive signal. The electronic device comprises readout circuitry coupled to the first and second piezoelectric material layers and configured to generate first and second sensed pressure values based upon high frequency drive signal, and determine an overall sensed pressure value based upon the first and second sensed pressure values. The electronic device comprises temperature compensation circuitry cooperating with the readout circuitry to compensate the overall sensed pressure values based upon the first and second sensed pressure values. The mobile wireless communications device comprises a controller coupled to the wireless communications circuitry and the electronic device and configured to perform at least one wireless communications function and selectively operate the electronic device.

A method of using an electronic device comprising a beam layer, a first piezoelectric material layer coupled to the beam layer, a second piezoelectric material layer coupled to the first piezoelectric material layer thereof on a surface thereof opposite the beam layer comprises using drive circuitry coupled to the first and second piezoelectric material layers to drive the first and second piezoelectric material layers with a low frequency drive signal for actuating the piezoelectric material layer and a high frequency drive signal for sensing respective first and second pressures applied to the first and second piezoelectric material layers, the high frequency drive signal having a higher frequency than the low frequency drive signal. The method comprises using readout circuitry coupled to the first and second piezoelectric material layers to generate first and second sensed pressure values based upon high frequency drive signal, and determine an overall sensed pressure value based upon the first and second sensed pressure values. The method comprises using temperature compensation circuitry to cooperate with the readout circuitry to compensate the overall sensed pressure values based upon the first and second sensed pressure values.

An electronic device comprises a beam layer and a piezoelectric material layer comprising a first piezoelectric material body coupled to the beam layer and at least one second piezoelectric material body coupled to and laterally adjacent the first piezoelectric material body and spaced from the beam layer. The electronic device comprises drive circuitry coupled to the first and at least one second piezoelectric material bodies and configured to drive the first and at least one second piezoelectric material bodies with a low frequency drive signal for actuating the first and at least one second piezoelectric material bodies and a high frequency drive signal for sensing respective first and at least one second pressures applied to the first and at least one second piezoelectric material bodies, the high frequency drive signal having a higher frequency than the low frequency drive signal. The electronic device comprises readout circuitry coupled to first and at least one second piezoelectric material bodies and configured to generate first and at least one second sensed pressure values based upon high frequency drive signal and determine an overall sensed pressure value based upon the first and at least one second sensed pressure values. The electronic device comprises temperature compensation circuitry cooperating with the readout circuitry and configured to compensate the overall sensed pressure value based upon the first and at least one second sensed pressure values.

The at least one second piezoelectric body comprises a plurality of second piezoelectric bodies.

The electronic device further comprises a plurality of electrodes coupled to the first and at least one, second piezoelectric material bodies, the drive circuitry, and the readout circuitry.

The first and at least one second material bodies each has a top and bottom and the plurality of electrodes are carried by the top and bottom.

The plurality of electrodes extend vertically within the first and at least one second piezoelectric material bodies.

The electronic device further comprises an adhesive material layer coupled between the beam layer and the first piezoelectric material body.

The low frequency drive signal is less than 1 kHz.

The high frequency drive signal is greater than 100 kHz.

A mobile wireless communications device comprises a housing, wireless communications circuitry carried by the housing, and an electronic device carried by the housing. The electronic device comprises a beam layer and a piezoelectric material layer comprising a first piezoelectric material body coupled to the beam layer, and at least one second piezoelectric material body coupled to and laterally adjacent the first piezoelectric material body and spaced from the beam layer. The electronic device comprises drive circuitry coupled to the first and at least one second piezoelectric material bodies and configured to drive the first and at least one second piezoelectric material bodies with a low frequency drive signal for actuating the first and at least one second piezoelectric material bodies and a high frequency drive signal for sensing respective first and at least one second pressures applied to the first and at least one second piezoelectric material bodies, the high frequency drive signal having a higher frequency than the low frequency drive signal. The electronic device comprises readout circuitry coupled to the first and at least one second piezoelectric material bodies and configured to generate first and at least one second sensed pressure values based upon high frequency drive signal, determine an overall sensed pressure value based upon the first and at least one second sensed pressure values, and temperature compensation circuitry cooperating with the readout circuitry and configured to compensate the overall sensed pressure value based upon the first and at least one second sensed pressure values. The mobile wireless communications device comprises a controller coupled to the wireless communications circuitry and the electronic device and configured to perform at least one wireless communications function and selectively operate the electronic device.

A method of using an electronic device comprising a beam layer, a piezoelectric material layer comprising a first piezoelectric material body coupled to the beam layer, and at least one second piezoelectric material body coupled to and laterally adjacent the first piezoelectric material body and spaced from the beam layer comprises using drive circuitry coupled to the first and at least one second piezoelectric material bodies to drive the first and at least one second piezoelectric material bodies with a low frequency drive signal for actuating the first and at least one second piezoelectric material bodies and a high frequency drive signal for sensing respective first and at least one second pressures applied to the first and at least one second piezoelectric material bodies, the high frequency drive signal having a higher frequency than the low frequency drive signal. The method comprises using readout circuitry coupled to first and at least one second piezoelectric material bodies to generate first and at least one second sensed pressure values based upon high frequency drive signal, determine an overall sensed pressure value based upon the first and at least one second sensed pressure values. The method comprises using temperature compensation circuitry to cooperate with the readout circuitry to compensate the overall sensed pressure value based upon the first and at least one second sensed pressure values.

An electronic device comprises a beam layer, a piezoelectric material layer coupled to the beam layer, and a plurality of spaced apart electrodes carried by the piezoelectric material layer defining a plurality of force pixels. The electronic device comprises drive circuitry coupled to the piezoelectric material layer and configured to drive the piezoelectric material layer with a low frequency drive signal for actuating the piezoelectric material layer and a high frequency drive signal for sensing a pressure applied to the piezoelectric material layer, the high frequency drive signal having a higher frequency than the low frequency drive signal. The electronic device comprises readout circuitry coupled to the piezoelectric material layer and configured to generate a sensed pressure value based upon the high frequency drive signal. The electronic device comprises temperature compensation circuitry cooperating with the readout circuitry to compensate the sensed pressure value based upon the plurality of force pixels.

The temperature compensation circuitry cooperates with the readout circuitry to compensate the sensed pressure value based upon at least one of a location and sensed force applied to ones of the plurality of force pixels.

The low frequency drive signal is less than 1 kHz.

The high frequency drive signal is greater than 100 kHz.

A mobile wireless communications device comprises a housing, wireless communications circuitry carried by the housing, and an electronic device carried by the housing. The electronic device comprises a beam layer, a piezoelectric material layer coupled to the beam layer, and a plurality of spaced apart electrodes carried by the piezoelectric material layer defining a plurality of force pixels. The electronic device comprises drive circuitry coupled to the piezoelectric material layer and configured to drive the piezoelectric material layer with a low frequency drive signal for actuating the piezoelectric material layer and a high frequency drive signal for sensing a pressure applied to the piezoelectric material layer, the high frequency drive signal having a higher frequency than the low frequency drive signal. The electronic device comprises readout circuitry coupled to the piezoelectric material layer and configured to generate a sensed pressure value based upon the high frequency drive signal, and temperature compensation circuitry cooperating with the readout circuitry to compensate the sensed pressure value based upon the plurality of force pixels. The mobile wireless communications device comprises a controller coupled to the wireless communications circuitry and the electronic device and configured to perform at least one wireless communications function and selectively operate the electronic device.

A method of using an electronic device comprising a beam layer, a piezoelectric material layer coupled to the beam layer, and a plurality of spaced apart electrodes carried by the piezoelectric material layer defining a plurality of force pixels comprises using drive circuitry coupled to the piezoelectric material layer to drive the piezoelectric material layer with a low frequency drive signal for actuating the piezoelectric material layer and a high frequency drive signal for sensing a pressure applied to the piezoelectric material layer, the high frequency drive signal having a higher frequency than the low frequency drive signal. The method comprises using readout circuitry coupled to the piezoelectric material layer to generate a sensed pressure value based upon the high frequency drive signal. The method comprises using temperature compensation circuitry to cooperate with the readout circuitry to compensate the sensed pressure value based upon the plurality of force pixels.

That which is claimed is:

1. An electronic device comprising:
a beam layer;
a piezoelectric material layer coupled to the beam layer;
a temperature sensor adjacent the piezoelectric material layer;
drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer, the high frequency drive signal having a higher frequency than the low frequency drive signal;
readout circuitry coupled to the piezoelectric material layer and configured to generate a sensed pressure value based upon the high frequency drive signal; and
temperature compensation circuitry cooperating with the readout circuitry to compensate the sensed pressure value based upon the temperature sensor.

2. The electronic device of claim 1 wherein the temperature sensor comprises an electronic temperature sensor.

3. The electronic device of claim 1 further comprising a plurality of electrodes coupled to the piezoelectric material layer and the drive circuitry and the readout circuitry.

4. The electronic device of claim 3 wherein the piezoelectric material layer has a top and bottom; and wherein the plurality of electrodes are carried by the top and bottom.

5. The electronic device of claim 3 wherein the plurality of electrodes extend vertically within the piezoelectric material layer.

6. The electronic device of claim 1 further comprising an adhesive material layer coupled between the beam layer and the piezoelectric material layer.

7. The electronic device of claim 1 wherein the low frequency drive signal is less than 1 kHz.

8. The electronic device of claim 1 wherein the high frequency drive signal is greater than 100 kHz.

9. A mobile wireless communications device comprising:
a housing;
wireless communications circuitry carried by the housing;
an electronic device carried by the housing and comprising
a beam layer,
a piezoelectric material layer coupled to the beam layer,
a temperature sensor adjacent the piezoelectric material layer,
drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer, the high frequency drive signal having a higher frequency than the low frequency drive signal,
readout circuitry coupled to the piezoelectric material layer and configured to generate a sensed pressure value based upon the high frequency drive signal, and
temperature compensation circuitry cooperating with the readout circuitry to compensate the sensed pressure value based upon the temperature sensor; and
a controller coupled to the wireless communications circuitry and the electronic device and configured to perform at least one wireless communications function and selectively operate the electronic device.

10. A method of using an electronic device comprising a beam layer, a piezoelectric material layer coupled to the beam layer, and a temperature sensor adjacent the piezoelectric material layer, the method comprising:
using drive circuitry coupled to the piezoelectric material layer to drive the piezoelectric material layer with a low frequency drive signal for actuating the piezoelectric material layer, and a high frequency drive signal for sensing a pressure applied to the piezoelectric material layer, the high frequency drive signal having a higher frequency than the low frequency drive signal;
using readout circuitry coupled to the piezoelectric material layer to generate a sensed pressure value based upon the high frequency drive signal; and
using temperature compensation circuitry to cooperate with the readout circuitry to compensate the sensed pressure value based upon the temperature sensor.

11. An electronic device comprising:
a beam layer;
a piezoelectric material layer coupled to the beam layer and having at least one temperature dependent characteristic associated therewith;

drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer, the high frequency drive signal having a higher frequency than the low frequency drive signal;

readout circuitry coupled to the piezoelectric material layer and configured to generate a sensed pressure value based upon the high frequency drive signal; and temperature compensation circuitry cooperating with the readout circuitry to compensate the sensed pressure value based upon the at least one temperature dependent characteristic.

12. The electronic device of claim 11 wherein the at least one temperature dependent characteristic comprises at least one of resistance, bulk resistivity, and resonant frequency.

13. The electronic device of claim 11 further comprising a plurality of electrodes coupled to the piezoelectric material layer and the drive circuitry and the readout circuitry.

14. The electronic device of claim 13 wherein the piezoelectric material layer has a top and bottom; and wherein the plurality of electrodes are carried by the top and bottom.

15. The electronic device of claim 13 wherein the plurality of electrodes extend vertically within the piezoelectric material layer.

16. The electronic device of claim 11 further comprising an adhesive material layer coupled between the beam layer and the piezoelectric material layer.

17. The electronic device of claim 11 wherein the low frequency drive signal is less than 1 kHz.

18. The electronic device of claim 11 wherein the high frequency drive signal is greater than 100 kHz.

19. A mobile wireless communications device comprising:
   a housing;
   wireless communications circuitry carried by the housing;
   an electronic device carried by the housing and comprising
      a beam layer,
      a piezoelectric material layer coupled to the beam layer and having at least one temperature dependent characteristic associated therewith,
      drive circuitry coupled to the piezoelectric material layer and configured to drive the piezoelectric material layer with a low frequency drive signal for actuating the piezoelectric material layer, and a high frequency drive signal for sensing a pressure applied to the piezoelectric material layer, the high frequency drive signal having a higher frequency than the low frequency drive signal,
      readout circuitry coupled to the piezoelectric material layer and configured to generate a sensed pressure value based upon the high frequency drive signal, and
      temperature compensation circuitry cooperating with the readout circuitry to compensate the sensed pressure value based upon the at least one temperature dependent characteristic; and
   a controller coupled to the wireless communications circuitry and the electronic device and configured to perform at least one wireless communications function and selectively operate the electronic device.

20. A method of using an electronic device comprising a beam layer, and a piezoelectric material layer coupled to the beam layer, the piezoelectric material layer having at least one temperature dependent characteristic associated therewith, the method comprising:

using drive circuitry coupled to the piezoelectric material layer to drive the piezoelectric material layer with a low frequency drive signal for actuating the piezoelectric material layer, and a high frequency drive signal for sensing a pressure applied to the piezoelectric material layer, the high frequency drive signal having a higher frequency than the low frequency drive signal;

using readout circuitry coupled to the piezoelectric material layer to generate a sensed pressure value based upon the high frequency drive signal; and using temperature compensation circuitry to cooperate with the readout circuitry to compensate the sensed pressure value based upon the at least one temperature dependent characteristic.

* * * * *